United States Patent
Akagi et al.

(10) Patent No.: US 12,105,412 B2
(45) Date of Patent: Oct. 1, 2024

(54) REFLECTIVE MASK BLANK, REFLECTIVE MASK, METHOD OF MANUFACTURING REFLECTIVE MASK BLANK, AND METHOD OF MANUFACTURING REFLECTIVE MASK

(71) Applicant: AGC Inc., Tokyo (JP)

(72) Inventors: Daijiro Akagi, Tokyo (JP); Hiroaki Iwaoka, Tokyo (JP); Wataru Nishida, Tokyo (JP); Ichiro Ishikawa, Tokyo (JP); Kenichi Sasaki, Tokyo (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 18/444,020

(22) Filed: Feb. 16, 2024

(65) Prior Publication Data

US 2024/0272541 A1    Aug. 15, 2024

Related U.S. Application Data

(63) Continuation of application No. PCT/JP2022/047930, filed on Dec. 26, 2022.

(30) Foreign Application Priority Data

Dec. 28, 2021   (JP) ................................ 2021-214753

(51) Int. Cl.
   *G03F 1/24*    (2012.01)
(52) U.S. Cl.
   CPC ..................... *G03F 1/24* (2013.01)
(58) Field of Classification Search
   CPC ........................................................ G03F 1/24
   USPC ............................................................ 430/5
   See application file for complete search history.

(56) References Cited

U.S. PATENT DOCUMENTS

| | | |
|---|---|---|
| 2012/0225375 A1 | 9/2012 | Mikami |
| 2015/0261082 A1 | 9/2015 | Shih et al. |
| 2021/0096456 A1 | 4/2021 | Suzuki et al. |
| 2023/0072220 A1 | 3/2023 | Nakagawa et al. |

FOREIGN PATENT DOCUMENTS

| | | |
|---|---|---|
| JP | 2004-363570 A | 12/2004 |
| JP | 4346656 B2 | 7/2009 |
| JP | 2021-056502 A | 4/2021 |
| JP | 2021-184108 A | 12/2021 |
| WO | WO 2011/071086 A1 | 6/2011 |

OTHER PUBLICATIONS

International Search Report issued Feb. 28, 2023, in PCT/JP2022/047930, filed on Dec. 26, 2022 (2 pages).

*Primary Examiner* — Christopher G Young
(74) *Attorney, Agent, or Firm* — Oblon, McClelland, Maier & Neustadt, L.L.P.

(57) ABSTRACT

A reflective mask blank for EUV lithography includes a substrate; a multilayer reflective film that reflects EUV light; a protection film that protects the multilayer reflective film; and an absorption film that absorbs the EUV light. The substrate, the multilayer reflective film, the protection film, and the absorption film are arranged in this order from bottom to top. The protection film includes an upper layer made of a rhodium-based material containing Rh as a main component that contains only Rh, or contains Rh and at least one element selected from a group consisting of N, O, C, B, Ru, Nb, Mo, Ta, Ir, Pd, Zr, and Ti; and a lower layer satisfying a condition $k < -0.15n + 0.16$ in an EUV region where n represents a refractive index and k represents an extinction coefficient.

14 Claims, 8 Drawing Sheets

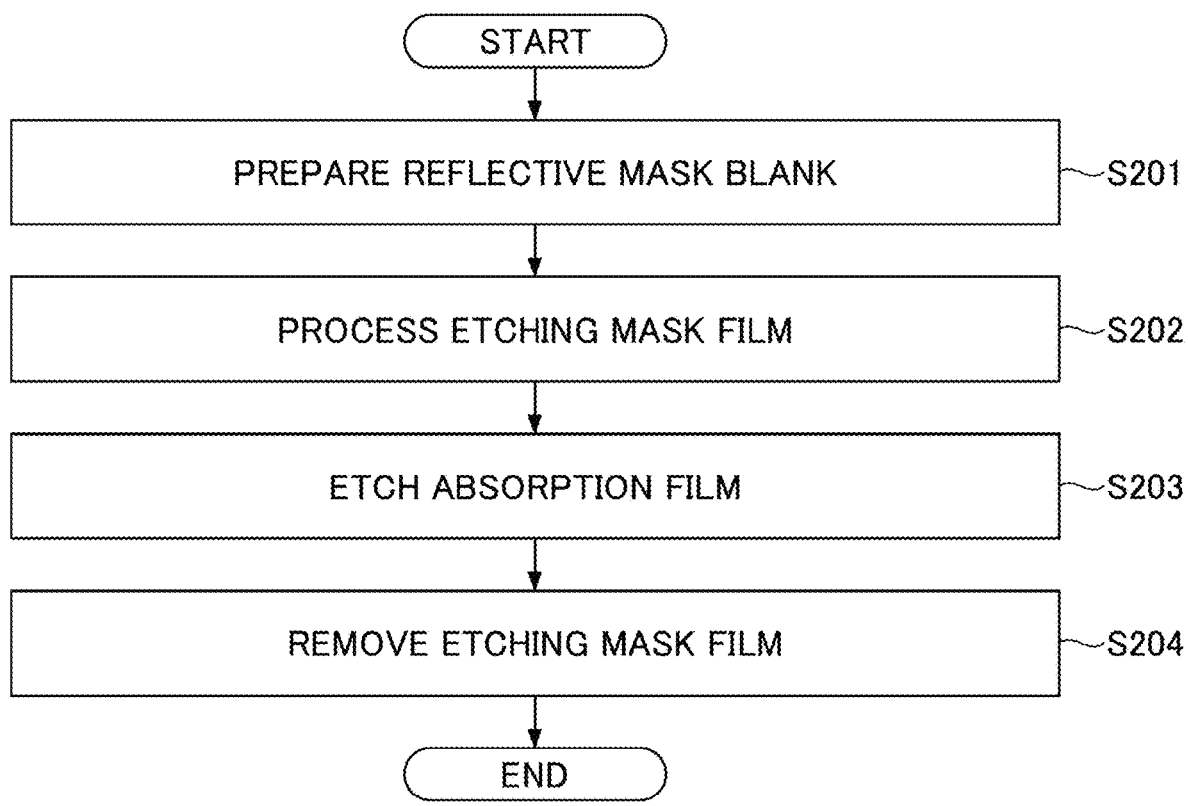

REFLECTIVE MASK BLANK, REFLECTIVE MASK, METHOD OF MANUFACTURING REFLECTIVE MASK BLANK, AND METHOD OF MANUFACTURING REFLECTIVE MASK

CROSS-REFERENCE TO RELATED APPLICATION

The present application is a continuation application of International Application No. PCT/JP2022/047930, filed Dec. 26, 2022, which claims priority to Japanese Patent Application No. 2021-214753 filed Dec. 28, 2021. The contents of these applications are incorporated herein by reference in their entirety.

BACKGROUND OF THE INVENTION

1. Field of the Invention

The present disclosure relates to a reflective mask blank, a reflective mask, a method of manufacturing a reflective mask blank, and a method of manufacturing a reflective mask.

2. Description of the Related Art

Along with the recent miniaturization of semiconductor devices, EUV lithography (EUVL), an exposure technology using Extreme Ultra-Violet (EUV) light, has been developed. The EUV light includes a soft X-ray and a vacuum ultraviolet light, and specifically has a wavelength of 0.2 nm-100 nm. At present, EUV light with a wavelength of about 13.5 nm is mainly studied.

In the EUVL, a reflective mask is used. The reflective mask includes a substrate, a multilayer reflective film, and an absorption film in which an opening pattern is formed, in this order. In the EUVL, the opening pattern of the reflective mask is transferred to a target substrate such as a semiconductor substrate.

As a configuration of the reflective mask, a configuration in which a protection film is further provided between the multilayer reflective film and the absorption film is also known. The protection film is a film that has a function of protecting the multilayer reflective film from an etching process or the like performed when forming an opening pattern in the absorption film at the time of manufacturing the mask, and is left on the reflective mask even after the manufacturing.

For example, Japanese Patent No. 4346656 describes a reflective mask blank including a substrate, a multilayer reflective film formed on the substrate to reflect exposure light, an absorption film formed on the multilayer reflective film to selectively absorb the exposure light, and an intermediate layer formed between the multilayer reflective film and the absorption film and resistant to an etching environment of the absorption film, the material of the intermediate layer containing Si and at least one element selected from Cr, Ru, and Rh.

SUMMARY OF THE INVENTION

Problems to be Solved by the Invention

The material of the protection film is selected in view of the material of the absorption film and the etching conditions corresponding to the absorption film. In recent years, various materials have been studied for the absorption film. Depending on the material of the absorption film and the etching conditions for the absorption film, the resistance of the material of the conventional protection film may not be sufficient, and the multilayer reflective film may not be sufficiently protected. On the other hand, when selecting the material of the protection film, it is necessary to consider the mixing between the protection film and the multilayer reflective film immediately below the protection film and the influence on the reflectance of exposure light.

Therefore, an object of an aspect of the present disclosure is to provide a configuration including a protection film that has excellent etching resistance and suppresses mixing with a multilayer reflective film.

Means for Solving the Problem

According to an aspect of the present disclosure, a reflective mask blank for EUV lithography includes a substrate; a multilayer reflective film that reflects EUV light; a protection film that protects the multilayer reflective film; and an absorption film that absorbs the EUV light, arranged in this order from bottom to top. The protection film includes an upper layer made of a rhodium-based material containing Rh, or containing Rh and at least one element selected from a group consisting of N, O, C, B, Ru, Nb, Mo, Ta, Ir, Pd, Zr, and Ti, the rhodium-based material containing 50 at % to 100 at % of Rh; and a lower layer containing at least one element selected from a group consisting of Ru, Nb, Mo, Zr, Y, C, and B, and satisfying a condition $k<-0.15n+0.16$ in an EUV region [in the formula, n represents a refractive index and k represents an extinction coefficient].

Effects of the Invention

According to an aspect of the present disclosure, it is possible to provide a configuration including a protection film which has excellent etching resistance and in which mixing with a multilayer reflective film is suppressed.

BRIEF DESCRIPTION OF THE DRAWINGS

Other objects and further features of the present disclosure will be apparent from the following detailed description when read in conjunction with the accompanying drawings, in which:

FIG. 6 is a flowchart showing a method of manufacturing a reflective mask according to the embodiment;

DESCRIPTION OF THE EMBODIMENT

Figure 1:
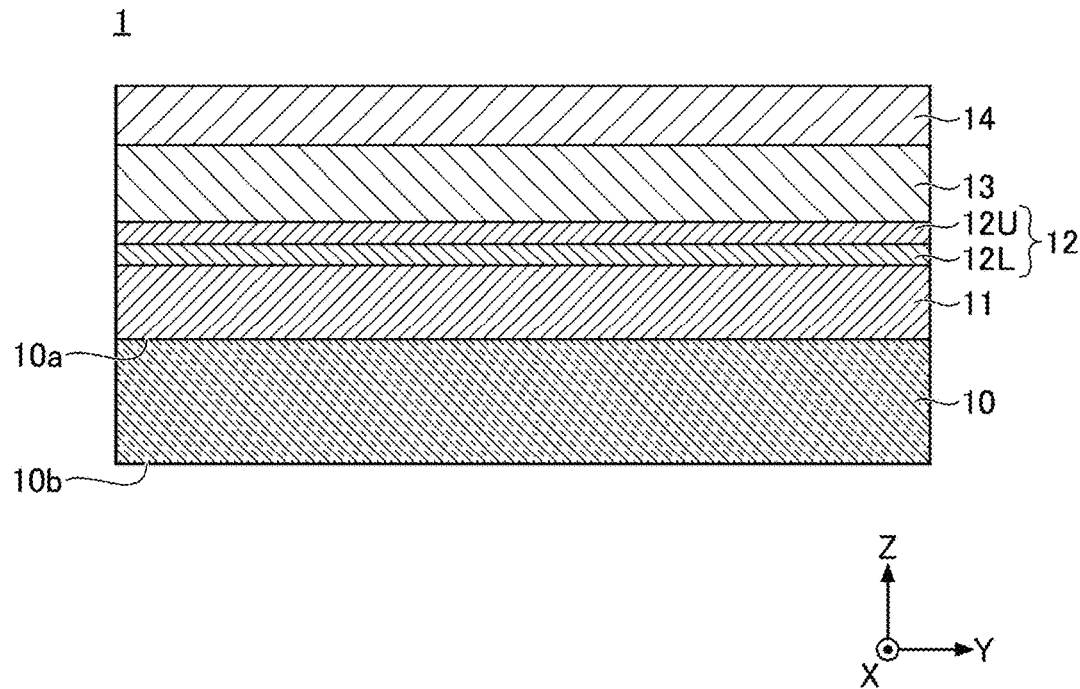
FIG. 1 is a cross-sectional view showing a reflective mask blank according to an embodiment.

In the following, embodiments of the present disclosure will be described with reference to the accompanying drawings. In each drawing, to the same or corresponding configurations, the same reference numeral will be assigned, and an explanation may be omitted. In the specification, "to" or a symbol "-" representing a numerical range indicates that values before and after the symbol are included as a lower limit value and an upper limit value, respectively.

Figure 2:
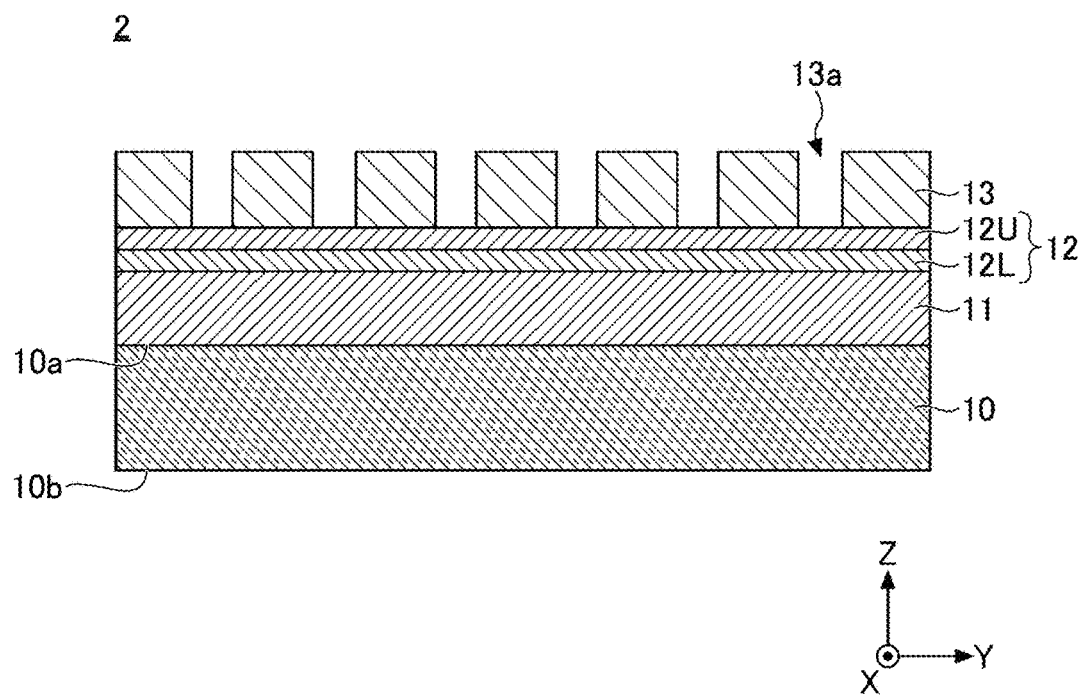
FIG. 2 is a cross-sectional view showing a reflective mask according to the embodiment.
Figure 3:
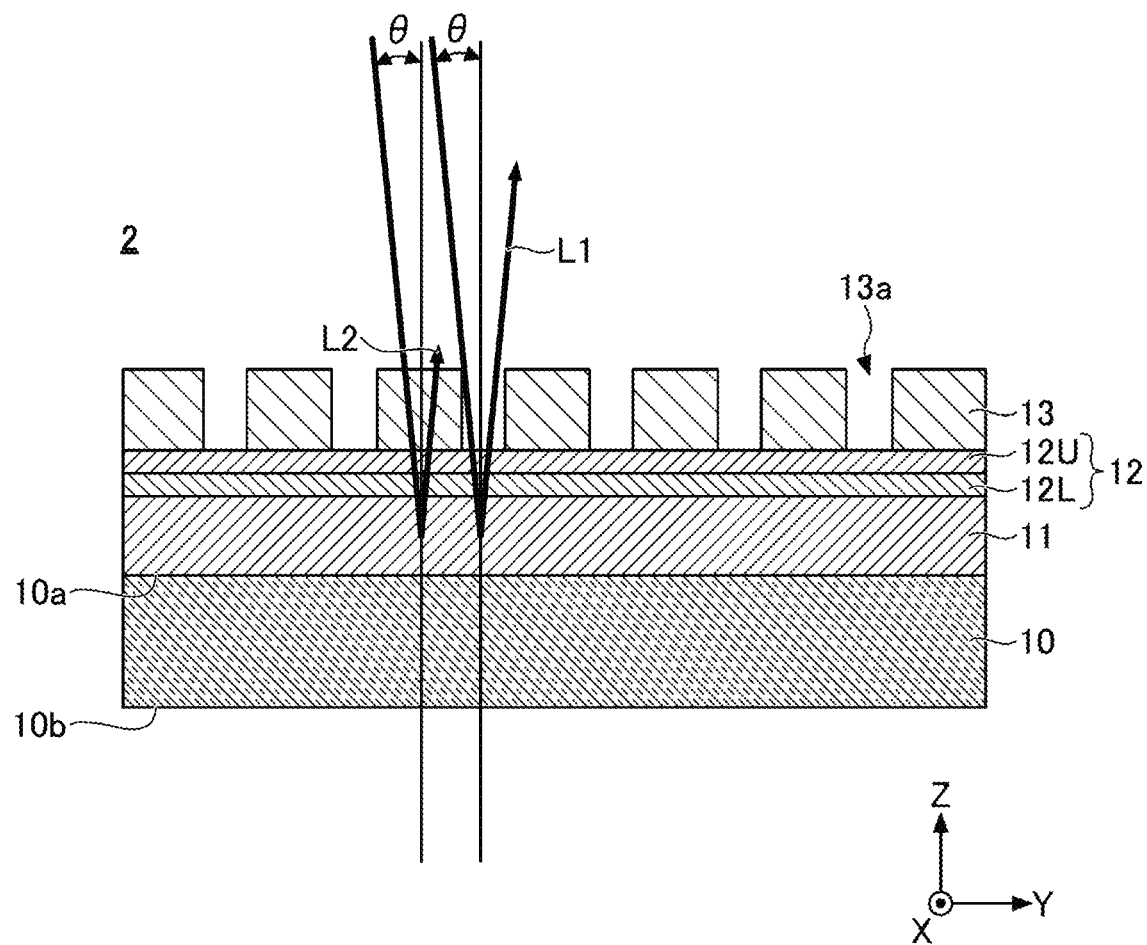
FIG. 3 is a cross-sectional view of the reflective mask for illustrating an example of EUV light reflected by the reflective mask of FIG. 2.

In FIGS. 1 to 3, an X-axis direction, a Y-axis direction, and a Z-axis direction are directions orthogonal to each other. The Z-axis direction is a direction perpendicular to the surface direction of the substrate 10, and a positive direction (+Z direction) of the Z-axis is defined to be an upward direction, and a negative direction (−Z direction) of the Z-axis is defined to be a downward direction. Here, the side irradiated with EUV light is the upper side, and the opposite side is the lower side. The X-axis direction is a direction perpendicular to an incident plane of EUV light (a plane including an incident light beam and a reflected light beam). As shown in FIG. 3, when viewed from the X-axis direction, the incident light beam and the reflected light beam are inclined towards the Y-axis direction on propagating in the −Z-axis direction or the +Z-axis direction.

A reflective mask blank 1 according to an embodiment will be described with reference to FIG. 1. The reflective mask blank 1 includes at least the substrate 10, a multilayer reflective film 11, a protection film 12, an absorption film 13, and an etching mask film 14, in this order from bottom to top. As shown in FIG. 1, in the present embodiment, the protection film 12 includes at least a lower layer 12L and an upper layer 12U formed on the lower layer 12L. The multilayer reflective film 11, the lower layer 12L of the protection film 12, the upper layer 12U of the protection film 12, the absorption film 13, and the etching mask film 14 are formed on the upper side main surface (upper surface) 10a of the substrate 10 in this order from bottom to top.

The reflective mask blank 1 may further have a functional film (not shown in FIG. 1). For example, the reflective mask blank 1 may have a conductive film on the lower side. For example, the conductive film may be formed on the lower surface 10a opposite to the upper surface 10b of the substrate 10. The conductive film is used, for example, to attract a reflective mask 2 to an electrostatic chuck of an exposure apparatus.

Although not shown, the reflective mask blank 1 may have a buffer film between the protection film 12 and the absorption film 13. The buffer film protects the protection film 12 from an etching gas for forming an opening pattern 13a in the absorption film 13. The buffer film is etched more moderately than the absorption film 13. Different from the protection film 12, the buffer film ultimately has the same opening pattern as the opening pattern 13a of the absorption film 13.

Next, the reflective mask 2 according to the embodiment will be described with reference to FIGS. 2 and 3. In the reflective mask 2, for example, an opening pattern 13a corresponding to a desired pattern is formed in the absorption film 13 of the reflective mask blank 1 shown in FIG. 1. The etching mask film 14 shown in FIG. 1 is removed after the opening pattern 13a is formed in the absorption film 13. In the EUVL, the opening pattern 13a of the absorption film 13 is transferred to a target substrate, such as a semiconductor substrate. The transferring includes transferring a reduced opening pattern.

In the following, the substrate 10, the multilayer reflective film 11, the protection film 12, the absorption film 13, and the etching mask film 14 will be described.

The substrate 10 is, for example, a glass substrate. A material of the substrate 10 is preferably quartz glass containing $TiO_2$. Compared with general soda lime glass, a linear expansion coefficient of the quartz glass is small, and thereby a dimensional change due to a temperature change is small. The quartz glass may contain 80 mass %-95 mass % of $SiO_2$ and 4 mass %-17 mass % of $TiO_2$. When the $TiO_2$ content is 4 mass %-17 mass %, the linear expansion coefficient around room temperature is substantially zero, and almost no dimensional change around room temperature occurs. The quartz glass may contain a third component or impurity other than $SiO_2$ and $TiO_2$. The material of the substrate 10 may be crystallized glass in which a β-quartz solid solution is precipitated, silicon, metal, or the like.

As described above, the multilayer reflective film 11 and the like are formed on the upper surface 10a of the substrate 10. The size of the substrate 10 in a plan view (viewed in the Z-axis direction) is, for example, 152 mm longitudinally and 152 mm laterally. The longitudinal and lateral dimensions may be greater than or equal to 152 mm. Each of the upper surface 10a and the lower surface 10b of the substrate 10 has, for example, a square-shaped quality-guaranteed region having a size of 142 mm longitudinally and 142 mm laterally at the center thereof. Preferably, the quality-guaranteed region of the top surface 10a has a root mean square (RMS) roughness of less than or equal to 0.15 nm and a flatness of less than or equal to 100 nm. It is also preferred that the quality-guaranteed region of the upper surface 10a is free from a defect that may cause a phase defect.

The multilayer reflective film 11 is a film that reflects EUV light, and is formed by, for example, alternately stacking a high refractive index layer and a low refractive index layer. A material of the high refractive index layer is, for example, silicon (Si), and a material of the low refractive index layer is, for example, molybdenum (Mo). As the multilayer reflective film, a Mo/Si multilayer reflective film may be used. In addition, a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film, a Si/Ru/Mo/Ru multilayer reflective film, or the like can also be used as the multilayer reflective film 11.

The film thickness of each layer constituting the multilayer reflective film 11 and the number of repeating units of layers can be appropriately selected according to the material of each layer and a reflectance to EUV light. When the multilayer reflective film 11 is a Mo/Si multilayer reflective film, in order to achieve a reflectance of 60% or more with respect to EUV light having an incident angle θ (see FIG. 3) of 6°, a Mo layer having a film thickness of 2.3±0.1 nm and a Si layer having a film thickness of 4.5±0.1 nm may be stacked so that the number of repeating units is 30 or more and 60 or less. The multilayer reflective film 11 preferably has the reflectance of 60% or more to EUV light at an incident angle θ of 6°. The reflectance is more preferably 65% or more.

The method of forming each layer constituting the multilayer reflective film 11 is, for example, a DC sputtering method, a magnetron sputtering method, or an ion beam sputtering method. For example, film formation conditions for each of the Mo layer and the Si layer, when a Mo/Si multilayer reflective film is formed by the ion beam sputtering method, will be shown as follows.

<Film Formation Condition for Si Layer>
  Target: Si;
  Sputtering gas: Ar;
  Gas pressure: $1.3 \times 10^{-2}$ Pa-$2.7 \times 10^{-2}$ Pa;
  Ion acceleration voltage: 300 V-1500 V;
  Film formation rate: 0.030 nm/sec-0.300 nm/sec; and Film thickness of Si layer: 4.5±0.1 nm.
<Film Formation Condition for Mo Layer>
  Target: Mo;
  Sputtering gas: Ar;
  Gas pressure: $1.3 \times 10^{-2}$ Pa-$2.7 \times 10^{-2}$ Pa;
  Ion acceleration voltage: 300 V-1500 V;
  Film formation rate: 0.030 nm/sec-0.300 nm/sec; and
  Film thickness of Mo layer: 2.3±0.1 nm
<Repeating Unit of Si Layer and Mo Layer>
  Number of repeating units: 30-60 (preferably 40-50).

The protection film 12 is a film formed between the multilayer reflective film 11 and the absorption film 13, and having a function of protecting the multilayer reflective film 11. The protection film 12 protects the multilayer reflective film 11 from the etching gas for forming the opening pattern 13a (FIGS. 2 and 3) in the absorption film 13. The protection film 12 is not removed when the reflective mask 2 is manufactured, but remains on the multilayer reflective film 11. The protection film 12 either does not hinder reflection of EUV light by the multilayer reflective film 11 or minimizes a decrease in reflectance.

The etching gas for forming the opening pattern 13a in the absorption film 13 may be, for example, an oxygen-based gas, a halogen-based gas, or a mixture gas thereof, and is preferably an oxygen-based gas. The oxygen-based gas is suitably used when the absorption film 13 contains a ruthenium-based material. Examples of the oxygen-based gas include $O_2$ gas and $O_3$ gas). Examples of the halogen-based gas include a chlorine-based gas and a fluorine-based gas. The etching gas, particularly the oxygen-based gas, can be used not only during the manufacturing process of the reflective mask but also for cleaning the surface of the reflective mask at the time of maintenance after starting the use of the reflective mask.

The etching selection ratio, that is, the ratio (ER1/ER2) of the etching rate ER1 for the absorption film 13 by the etching gas to the etching rate ER2 for the protection film 12 by the etching gas may be preferably 10 or more, and more preferably 30 or more, and preferably 200 or less, and more preferably 100 or less.

As shown in FIGS. 1 to 3, the protection film 12 includes a lower layer 12L and an upper layer 12U. The lower layer 12L is a layer formed in contact with the uppermost surface of the multilayer reflective film 11, and the upper layer 12U is in contact with the lowermost surface of the absorption film 13. As described above, by forming the protection film 12 into a multi-layer structure, a material excellent in a predetermined function can be used for each layer, so that the entire protection film 12 can be made multifunctional.

The upper layer 12U may be a rhodium-based material. The rhodium (Rh)-based material may contain only Rh or may contain Rh and an element other than Rh. Among the materials contained in the upper layer 12U, Rh is preferably contained in the largest amount on an at % basis (on an atomic percent basis). It is preferable that the rhodium-based material contains Rh as a main component, that is, the content of Rh is 50 at % or more. The content of Rh in the rhodium-based material may be preferably from 50 at % to 100 at %, more preferably more than 50 at % and less than or equal to 100 at %. Since the upper layer 12U is made of a rhodium-based material, the protection film 12 has high etching resistance to an etching gas in the step of etching the absorption film 13 during the manufacture of the reflective mask 2. For example, in particular, when the upper layer 12U is made of a rhodium-based material, high dry etching resistance to an oxygen-based etching gas is obtained as compared with the case where the upper layer 12U is made of a ruthenium-based material. Therefore, when the opening pattern 13a is formed in the absorption film 13, it is possible to prevent the protection film 12 from being scraped off and the multilayer reflective film 11 from being damaged. In addition, even when an etching gas, particularly an oxygen-based etching gas, is used to clean the surface of the reflective mask 2 after the reflective mask starts to be used, the etching resistance of the protection film 12 can be enhanced, and the service life of the reflective mask 2 can be extended.

In addition, by forming the upper layer 12U from a rhodium-based material, the resistance of the protection film 12 to a sulfuric acid-hydrogen peroxide mixture (SPM cleaning liquid) or the like is also improved. Therefore, even in a step of removing the resist film (described later) or cleaning the reflective mask 2, the protection film 12 is maintained, and damage to the multilayer reflective film 11 can be suppressed. Furthermore, by using a rhodium-based material for the upper layer 12U, a relatively high reflectance with respect to EUV light can be maintained.

When the upper layer 12U contains an element other than Rh, it preferably contains at least one element selected from a group consisting of N, O, C, B, Ru, Nb, Mo, Ta, Ir, Pd, Zr, and Ti as the element other than Rh. In particular, the case where the element other than Rh contained in the upper layer 12U is at least one selected from a group consisting of N, O, C, and B is preferable from the viewpoint of reducing the crystallinity of the upper layer 12U and improving the smoothness. When the element other than Rh contained in the upper layer 12U contains at least one element selected from a group consisting of Ru, Nb, Mo, Zr, and Ti, the extinction coefficient k can be reduced while suppressing an increase in the refractive index n, and the reflectance to EUV light can be improved, which is preferable.

When the upper layer 12U contains Rh and an element other than Rh, the element ratio of Rh to the element other than Rh contained in the upper layer 12U may be preferably 50:50 to 99:1, and more preferably 70:30 to 95:5. In the present specification, an element ratio means a molar ratio. By setting the element ratio between Rh and the element other than Rh within the above range, the extinction coefficient k can be reduced while suppressing an increase in the refractive index n, so that the reflectance to EUV light can be improved and the upper layer 12U can be prevented from crystallizing.

Here, from the viewpoint of improving the resistance to the etching gas, it is preferable to use the above-described rhodium-based material as the material of the protection film 12. However, when the layer made of the rhodium-based material is directly formed on the multilayer reflective film 11, mixing may occur between the protection film 12 and the multilayer reflective film 11 depending on the deposition method of each layer, the material of the multilayer reflective film 11, and the like. The mixing between layers in the reflective mask blank 1 or the reflective mask 2 can be visually recognized by analyzing and observing the distribution state of elements by depth analysis by XPS, Rutherford backscattering analysis, or the like, or by an electron microscope photograph as disturbance of the interface or the like.

The inventors of the present application have found that mixing between the protection film 12 and the multilayer reflective film 11 can be suppressed by providing a lower layer 12L satisfying

[Math 1]

$$k < -0.15n + 0.16, \qquad (1)$$

where n is a refractive index and k is an extinction coefficient, in the EUV region between the upper layer 12U of the protection film 12 and the multilayer reflective film 11. That is, it has been found that by providing the lower layer 12L satisfying the above formula (1) in the present embodiment, the substances contained in the upper layer 12U can be prevented from diffusing downward toward the multilayer reflective film 11, and the substances contained in the lower layer 12L are unlikely to be diffused into the multilayer reflective film 11. When the multilayer reflective film 11 is a Si/Mo multilayer reflective film, mixing between the protection film 12 and the Si layer constituting the uppermost layer of the multilayer reflective film 11 can be suppressed. Mixing between layers leads to a decrease in reflectance and a decrease in durability. With the configuration of the present embodiment, the reflectance of the reflective mask 2 with respect to EUV light can be maintained by suppressing mixing between layers.

Figure 4:
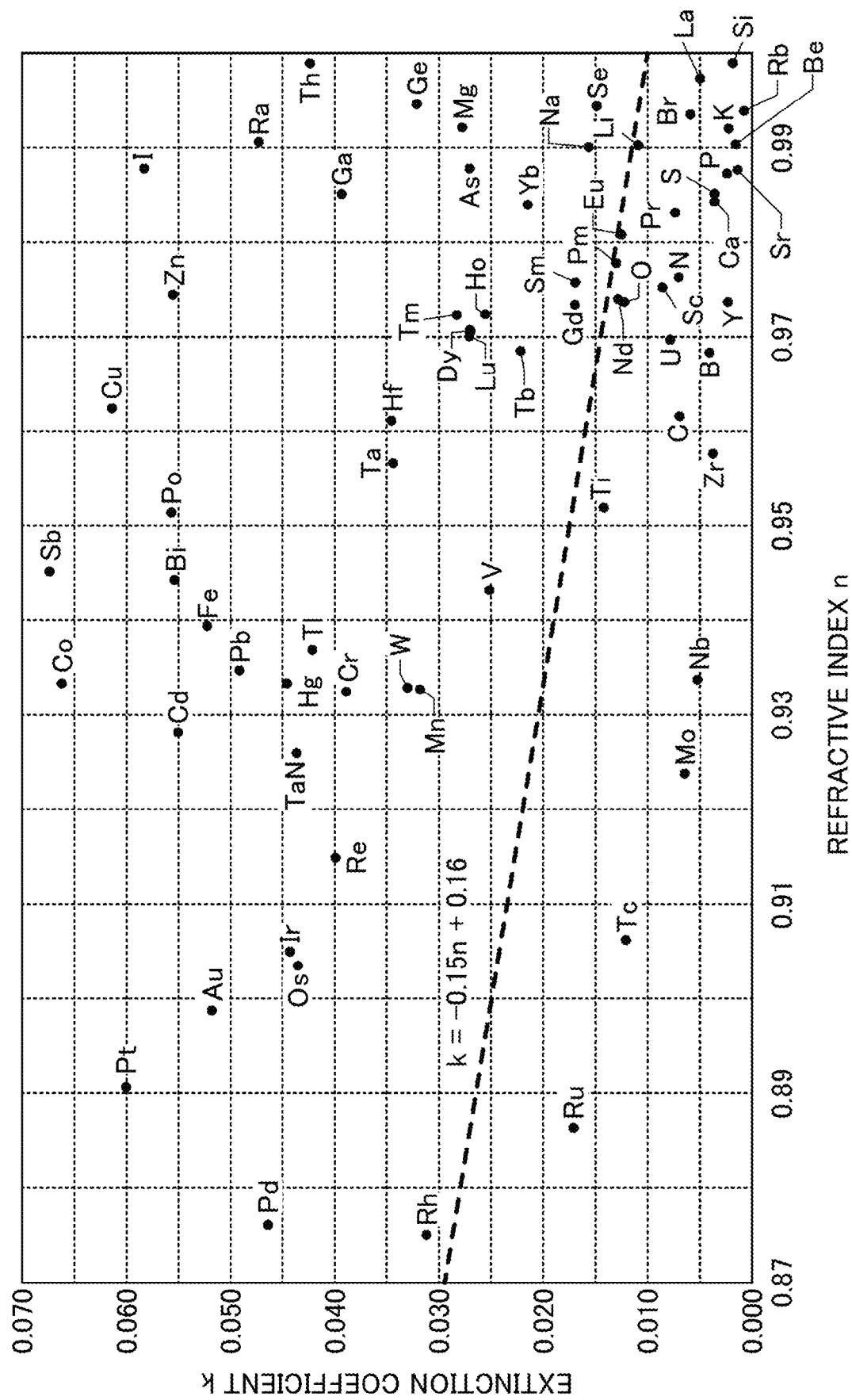
FIG. 4 is a diagram showing an example of a refractive index and an extinction coefficient of each substance.

In addition, as shown in FIG. 4, since a material (simple substance and/or compound) satisfying the condition k<−0.15n+0.16 can reduce both the refraction index n and the extinction coefficient k, the influence of the lower layer 12L itself on the reflectance of EUV light can also be suppressed.

For the refractive index n and the extinction coefficient k of a film or a layer, values in the database of the Center for X-Ray Optics, Lawrence Berkeley National Laboratory, or values calculated from a formula of "incident angle dependence" of reflectance, which will be described later, may be used. The incident angle θ of the EUV light, the reflectance R for the EUV light, the refractive index n of the film, and the extinction coefficient k of the film satisfy the following equation (2),

[Math 2]
$$R = \left| \frac{\sin\theta - ((n+ik)^2 - \cos^2\theta)^{1/2}}{\sin\theta + ((n+ik)^2 - \cos^2\theta)^{1/2}} \right|. \quad (2)$$

Measurements are made for the combination of the incident angle θ and the reflectance R a plurality of times, and the refractive index n and extinction coefficient k are estimated by fitting data so that errors between the plural measurement data and the values of the equation (2) are minimized.

The lower layer 12L preferably contains at least one element selected from a group consisting of Ru, Nb, Mo, Zr, Y, C, and B, and more preferably contains Ru. The lower layer 12L is preferably made of a ruthenium-based material. The ruthenium-based material may contain only Ru or may contain Ru and an element other than Ru. The content of Ru in the ruthenium-based material is preferably 50 at % to 100 at %. When the lower layer 12L contains the above-described element, suppression of mixing with the multilayer reflective film 11 and suppression of a decrease in the reflectance can be further promoted.

Furthermore, the refractive index n of the lower layer 12L is preferably 0.875 or more and 0.930 or less, more preferably 0.875 or more and 0.920 or less, even more preferably 0.875 or more and 0.910 or less, and particularly preferably 0.875 or more and 0.900 or less. The extinction coefficient k of the lower layer 12L is preferably 0.005 or more and 0.03 or less.

The lower layer 12L satisfying the above formula (1) in the present embodiment can be adjusted by, for example, an ion beam sputtering method or a reactive sputtering method. The lower layer 12L adjusted by the ion beam sputtering method becomes a dense film, and mixing between the protection film 12 and the multilayer reflective film 11 can be suppressed with a smaller thickness. In addition, when the lower layer 12L is adjusted by the reactive sputtering method, the multilayer reflective film 11 is inactivated by active plasma species at the time of forming the lower layer 12L, and mixing between the protection film 12 and the multilayer reflective film 11 can be suppressed. The gas used in the reactive sputtering method is preferably at least one of nitrogen gas, oxygen gas, $CO_2$ gas, and $CH_4$ gas, more preferably nitrogen gas.

As described above, in the present embodiment, by forming the protection film 12 from a combination of the upper layer 12U and the lower layer 12L, it is possible to provide a configuration including the protection film 12 which has high resistance to an etching gas, particularly an oxygen-based etching gas, suppresses mixing with the multilayer reflective film 11 of the lower layer, and maintains a good reflectance with respect to EUV light.

The thickness of the upper layer 12U is preferably 0.5 nm or more and 3.5 nm or less, more preferably 0.9 nm or more and 3.0 nm or less, and still more preferably 1.0 nm or more and 2.5 nm or less. By setting the thicknesses of the upper layer 12U within the above range, the protective function of the multilayer reflective film 11 in the etching step during the manufacture of the reflective mask can be sufficiently ensured, and a decrease in the reflectance of the multilayer reflective film 11 can be suppressed. The thickness of the lower layer 12L is preferably 0.4 nm or more and 2.5 nm or less, more preferably 0.5 nm or more and 2.5 nm or less, and even more preferably 0.5 nm or more and 1.6 nm or less. By setting the thicknesses of the lower layer 12L in the above range, it is possible to sufficiently suppress the material of the upper layer 12U from diffusing into the multilayer reflective film 11, and it is also possible to suppress a decrease in the reflectance of the multilayer reflective film 11. Furthermore, the total thickness of the protection film 12 is preferably 1.0 nm or more and 5.0 nm or less, and more preferably 2.0 nm or more and 3.5 nm or less.

The root mean square (RMS) roughness of the upper surface of the protection film 12 (the surface on which the absorption film is formed), i.e., the upper surface of the upper layer 12U is preferably 0.3 nm or less, and more preferably 0.1 nm or less.

The method of forming the protection film 12 is not particularly limited for both the upper layer 12U and the lower layer 12L. For example, a DC sputtering method, a magnetron sputtering method (hereinafter also referred to as MS method), an ion beam sputtering method (hereinafter also referred to as IBD method), and the like may be employed. It is preferable that the upper layer 12U and the lower layer 12L are continuously formed without being exposed to the atmosphere (i.e., without being opened to the atmosphere) during the film formation. The film formation is more preferably performed continuously without being exposed to the atmosphere after the formation of the multilayer reflective film 11 and until the completion of the formation of the upper layer 12U and the lower layer 12L. That is, the multilayer reflective film 11 may be once opened to the atmosphere after the formation of the multilayer reflective film 11 is completed, but it is more preferable to continuously form the multilayer reflective film 11 without being opened to the atmosphere until the formation of the upper layer 12U of the protection film is completed. By successive film formation without exposure to the atmosphere, formation of an oxide which might cause a decrease in reflectance can be suppressed. Further, the film formation is even more preferably performed continuously without being exposed to the atmosphere after the multilayer reflective film 11 is formed and until the film formation of the upper layer 12U and the lower layer 12L is completed and then the film formation of the absorption film 13 is completed.

When the Rh film is formed as the upper layer 12U by the magnetron sputtering method, an example of film formation conditions is as follows.
<Film Formation Conditions for Rh Film>
Target: Rh;
Sputtering gas: Ar;
Gas pressure: 0.10 Pa to 0.20 Pa;
Power density of target: 1.0 W/cm$^2$ to 2.0 W/cm$^2$;
Film formation rate: 0.02 nm/sec to 0.07 nm/sec; and
Film thickness of Rh film: 0.5 nm to 3.5 nm.

When the Ru film is formed as the lower layer 12L by using the ion beam sputtering method, an example of film formation conditions is as follows.
<Film Formation Conditions for Ru Film>
Target: Ru;
Sputtering gas: Ar;
Gas pressure: 0.010 Pa to 0.020 Pa;
Film formation rate: 0.01 nm/sec to 0.10 nm/sec; and
Film thickness of Ru film: 0.5 nm to 2.5 nm.

As shown in FIG. 1, the absorption film 13 in the reflective mask blank 1 is a film in which the opening pattern 13a is to be formed. That is, in the manufacturing process of the reflective mask 2, the reflective mask blank 1 is processed by forming the opening pattern 13a in the absorption film 13, and the reflective mask 2 is obtained.

The absorption film 13 absorbs EUV light. The absorption film 13 may be a phase shift film, and may not only absorb EUV light but also shift a phase of first EUV light L1 with respect to a phase of second EUV light L2 as shown in FIG. 3, for example. The first EUV light L1 is light that passes through the opening pattern 13a without passing through the absorption film 13, is reflected by the multilayer reflective film 11, and passes through the opening pattern 13a without passing through the absorption film 13 again. The second EUV light L2 is light that passes through the absorption film 13 while being partially absorbed by the absorption film 13, is reflected by the multilayer reflective film 11, and passes through the absorption film 13 while being partially absorbed again by the absorption film 13.

The phase difference, which is greater than or equal to zero, between the first EUV light L1 and the second EUV light L2 is, for example, 170°-250°. A phase of the first EUV light L1 may be advanced or retarded from a phase of the second EUV light L2. The phase shift film can improve a contrast of a transferred image by utilizing an interference between the first EUV light L1 and the second EUV light L2. The transferred image is an image obtained by transferring the opening pattern 13a of the absorption film 13 to a target substrate.

In EUVL, the so-called shadowing effect occurs. The shadowing effect is caused by an incident angle θ of EUV light that is not 0° (e.g. 6°), which causes a region near the side wall of the opening pattern 13a that blocks the EUV light by the side wall, resulting in a positional displacement or dimensional displacement of the transferred image. To reduce the shadowing effect, lowering the side wall of the opening pattern 13a is effective, and thinning the absorption film 13 is effective.

The thickness of the absorption film 13 is, for example, less than or equal to 60 nm, and preferably less than or equal to 50 nm in order to reduce the shadowing effect. The thickness of the absorption film 13 is preferably more than or equal to 20 nm in order to secure the phase shift between the first EUV light L1 and the second EUV light L2, and more preferably more than or equal to 30 nm.

The absorption film 13 is not particularly limited, but preferably contains at least one metal element selected from a group consisting of Ru, Ir, Pt, Pd, Au, Ta, and Cr. Since the metal element has a relatively small refractive index (See FIG. 4), the film thickness of the absorption film (phase shift film) 13 can be made small. Accordingly, it is possible to reduce the above-described shadowing effect while ensuring the phase differences between the first EUV light L1 and the second EUV light L2. The absorption film 13 preferably contains Ru among the above-described metal elements. Even when the absorption film 13 contains Ru as described above, since the upper layer 12U of the protection film 12 contains the rhodium-based material in the present embodiment as described above, it is possible to obtain a good etching selection ratio between the absorption film 13 and the protection film 12, particularly a good etching selection ratio with respect to the oxygen-based gas. The absorption film 13 may have a two-layer structure including an absorption film lower layer and an absorption film upper layer. The absorption film lower layer is a layer formed in contact with the uppermost surface of the protection film 12. By adopting the two-layer structure, the phase differences between the first EUV light L1 and the second EUV light L2 can be adjusted. From the viewpoint of processing characteristics, a configuration in which the absorption film lower layer of the absorption film 13 contains Ta and the absorption film upper layer contains Ru, or a configuration in which the absorption film lower layer contains Ru and the absorption film upper layer contains Ir is preferable.

The absorption film 13 may further contain at least one non-metal element selected from N, O, B, and C in addition to the above-described metal element. By containing the non-metal element, the absorption film 13 can be prevented from being crystallized, and the roughness of the side wall of the opening pattern 13a can be reduced. The non-metal element preferably includes at least oxygen, and more preferably includes oxygen and nitrogen. When the absorption film 13 further contains a non-metal element in addition to the metal element, the absorption film 13 may be a RuN film, a TaN film, a RuTaON film, a TaON film, or the like.

The deposition method of the absorption film 13 may be a DC sputtering method, a magnetron sputtering method, an ion beam sputtering method, a reactive sputtering method, or the like.

When the RuTaON film is formed as the absorption film 13 by using the reactive sputtering method, an example of film formation conditions is as follows.
<Film Formation Conditions for RuTaON Film>
Target: Ru and Ta;
Power density of Ru target: 8.8 W/cm$^2$;
Power density of Ta target: 0.41 W/cm$^2$;
Sputtering gas: a mixture of Ar gas, $O_2$ gas, and $N_2$ gas;
Volume ratio of $O_2$ gas to the sputtering gas ($O_2/(Ar+O_2+N_2)$): 0.06; and
Volume ratio of $N_2$ gas to the sputtering gas ($N_2/(Ar+O_2+N_2)$): 0.21.

The etching mask film 14 is formed on the absorption film 13, and is used to form an opening pattern 13a in the absorption film 13. A resist film (not shown) is formed on the etching mask film 14. In the manufacturing process of the reflective mask 2, a first opening pattern is formed on the resist film, then a second opening pattern is formed on the etching mask film 14 using the first opening pattern, and then a third opening pattern 13a is formed on the absorption film 13 using the second opening pattern. The first opening pattern, the second opening pattern, and the third opening pattern 13a have identical dimensions and identical shapes in a plan view (viewed along the Z-axis direction). The etching mask film 14 enables thinning of the resist film.

The etching mask film 14 preferably contains at least one element selected from a group consisting of aluminum (Al), hafnium (Hf), yttrium (Y), chromium (Cr), niobium (Nb), titanium (Ti), molybdenum (Mo), tantalum (Ta), and silicon (Si). In addition to the above elements, the etching mask film 14 may contain at least one element selected from a group consisting of O, N, and B.

The film thickness of the etching mask film 14 is preferably 2 nm-30 nm, more preferably 2 nm-25 nm, and even more preferably 2 nm-10 nm. The deposition method of the etching mask film 14 is, for example, a DC sputtering method, a magnetron sputtering method, or an ion beam sputtering method.

According to another aspect of the present disclosure, a method of manufacturing a reflective mask blank may include
forming a multilayer reflective film on a substrate, the multilayer reflective film reflecting EUV light; forming a protection film that protects the multilayer reflective film; and
forming an absorption film that absorbs the EUV light.
The forming the protection film includes
(i) forming a lower layer that satisfies the condition $k < -0.15n + 0.16$, where n is a refractive index and k is an extinction coefficient, in an EUV region; and
(ii) forming an upper layer made of a rhodium-based material containing Rh or Rh and at least one element selected from a group consisting of N, O, C, B, Ru, Nb, Mo, Ta, Ir, Pd, Zr, and Ti.

Figure 5:
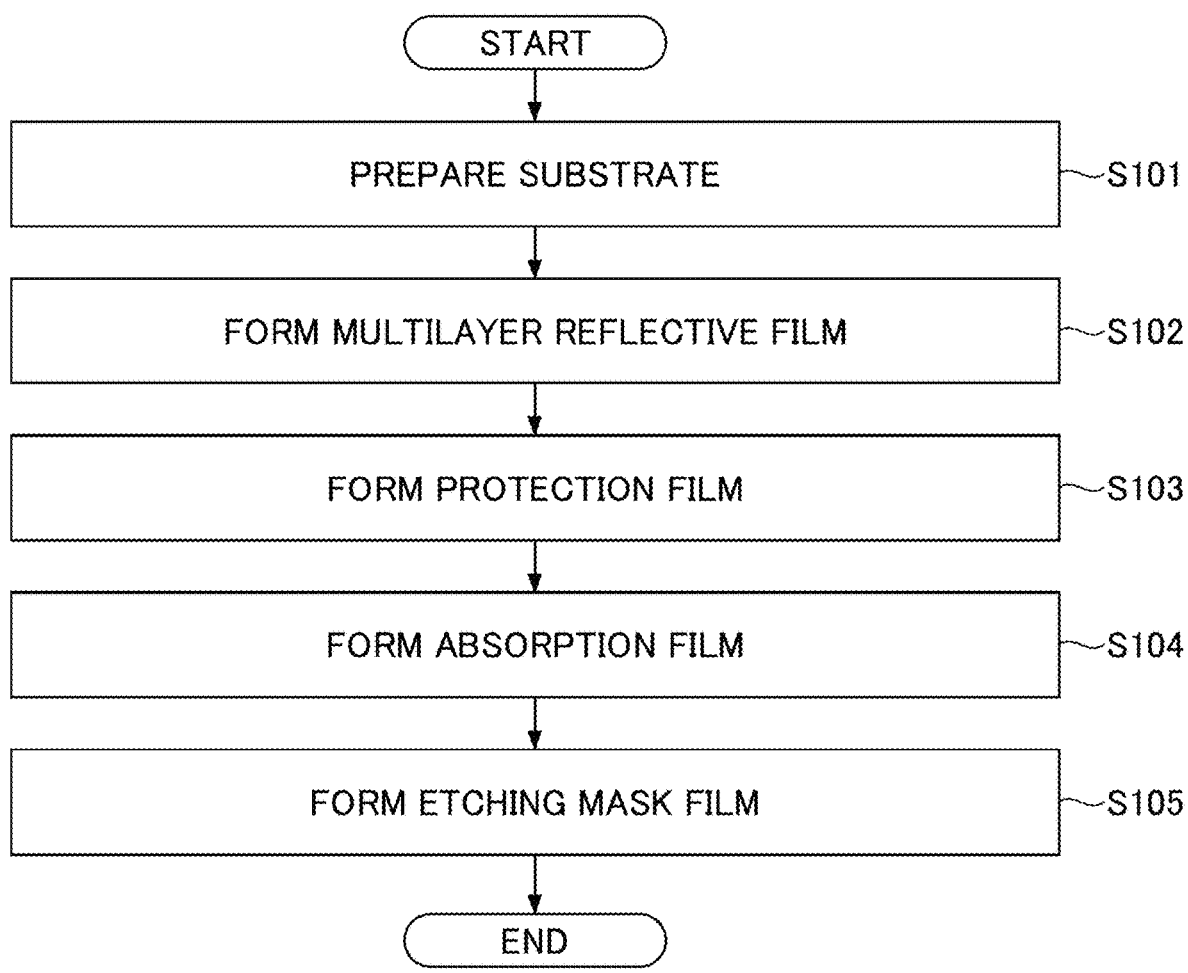
FIG. 5 is a flowchart showing a method of manufacturing a reflective mask blank according to the embodiment.

Next, a method of manufacturing the reflective mask blank 1 according to the embodiment of the present invention will be described with reference to FIG. 5. The method of manufacturing the reflective mask blank 1 has, for example, steps S101 to S105 shown in FIG. 8. A substrate 10 is prepared (step S101). A multilayer reflective film 11 is formed on a first main surface 10a of the substrate 10 (step S102). A protection film 12 is formed on the multilayer reflective film 11 (step S103). An absorption film 13 is formed on the protection film 12 (step S104). An etching mask film 14 is formed on the absorption film 13 (step S105).

The manufacturing method of the reflective mask blank 1 is required to have at least steps S101 to S104. The manufacturing method of the reflective mask blank 1 may further include a step of forming a functional film (not shown in FIG. 5).

According to yet another aspect of the present disclosure, a method of manufacturing a reflective mask may include
preparing a reflective mask blank; and
forming an opening pattern in the absorption film.
The method of manufacturing the reflective mask 2 according to the embodiment of the present invention will be described with reference to FIG. 6. The method of manufacturing the reflective mask 2 has steps S201 to S204 shown in FIG. 6. A reflective mask blank 1 is prepared (step S201). An etching mask film 14 is processed (step S202). A resist film (not shown) is provided on the etching mask film 14. A first opening pattern is formed on the resist film, then a second opening pattern is formed on the etching mask film 14 using the first opening pattern. A third opening pattern 13a is formed on the absorption film 13 using the second opening pattern (step S203). In step S203, the absorption film 13 is etched using etching gas. The resist film and the etching mask film 14 are removed (step S204). The resist film is removed using, for example, a sulfuric acid-hydrogen peroxide mixture. The etching mask film 14 is removed using, for example, etching gas. The etching gas used in step S204 (to remove the etching mask film 14) may be the same type as the etching gas used in step S203 (to form the opening pattern 13a). The manufacturing method of the reflective mask 2 is required to have at least steps S201 and S203.

EXAMPLES

Hereinafter, experimental data will be described. Examples 1, 2, and 6 to 13 are practical examples, and Examples 3 to 5 are comparative examples. TABLE 1 summarizes the film formation conditions and measurement results of the practical examples and the comparative examples. Examples 14 and 15 are also shown as reference examples.

TABLE 1

| | Protection film | | | | | EUV light |
|---|---|---|---|---|---|---|
| | Lower layer | | | Upper layer | | |
| | Film type | Film thickness (nm) | Film formation method | Film type | Film thickness (nm) | Film formation method | reflectance (%) Reflectance after formation of protection film |

| | Film type | Film thickness (nm) | Film formation method | Film type | Film thickness (nm) | Film formation method | EUV reflectance (%) |
|---|---|---|---|---|---|---|---|
| Ex. 1 | Ru | 1.0 | IBD | Rh | 1.0 | MS | 65.1 |
| Ex. 2 | Nb | 0.5 | MS | Rh | 2.5 | MS | 65.0 |
| Ex. 3 | Rh | 2.5 | MS | — | — | — | 63.9 |
| Ex. 4 | Ta | 0.5 | MS | Rh | 2.5 | MS | 63.5 |
| Ex. 5 | Ta | 1.0 | MS | Rh | 2.5 | MS | 61.7 |
| Ex. 6 | Ru | 0.9 | IBD | Rh | 1.6 | IBD | 65.8 |
| Ex. 7 | Ru | 0.9 | IBD | Rh | 1.8 | IBD | 65.7 |
| Ex. 8 | Ru | 0.9 | IBD | Rh | 2.0 | IBD | 65.3 |
| Ex. 9 | Ru | 1.1 | IBD | Rh | 1.6 | IBD | 65.7 |
| Ex. 10 | Ru | 1.1 | IBD | Rh | 1.8 | IBD | 65.5 |
| Ex. 11 | Ru | 1.1 | IBD | Rh | 2.0 | IBD | 65.0 |
| Ex. 12 | Ru | 1.6 | IBD | Rh | 1.6 | IBD | 65.3 |
| Ex. 13 | Ru | 1.6 | IBD | Rh | 1.8 | IBD | 65.0 |

Example 1

A reflective mask blank including the substrate, the multilayer reflective film, the protection film, and the absorption film was fabricated. A $SiO_2/TiO_2$ glass substrate (outer shape: a square of 6 inches (152 mm) per side and 6.3 mm thick) was prepared as a substrate. The glass substrate had a thermal expansion coefficient of $0.02 \times 10^{-7}/°$ C. at 20° C., a Young's modulus of 67 GPa, a Poisson's ratio of 0.17, and a specific rigidity of $3.07 \times 10^7$ $m^2/s^2$. The quality-guaranteed region of the upper surface of the substrate had a root-mean-square (RMS) roughness of 0.15 nm or less and a flatness of 100 nm or less due to polishing. On the back surface (lower surface) of the substrate, Cr film having a thickness of 100 nm was formed by the magnetron sputtering method. The sheet resistance of the Cr film was 100 Ω/□.

A Mo/Si multilayer reflective film was formed as the multilayer reflective film. The Mo/Si multilayer reflective film was formed by fixing the obtained substrate so that the Cr film on the back surface side faced a plate-shaped electrostatic chuck, and repeating formation of a Si layer (thickness: 4.5 nm) and formation of a Mo layer (thickness:

2.3 nm) on the surface of the substrate 40 times by the ion beam sputtering method. The total thickness of the Mo/Si multilayer reflective film was 272 nm (40(4.5 nm+2.3 nm)).

Further, a protection film composed of a lower layer of a Ru film and an upper layer of a Rh film was formed on the Si layer which was the uppermost layer of the Si/Mo multilayer reflective film. To be more specific, a Ru film (thickness: 1.0 nm) was formed as a lower layer of the protection film by the ion beam sputtering method, and a Rh film (thickness: 1.0 nm) was formed as an upper layer on the Ru film by the magnetron sputtering method. Ru used in the lower layer is a material satisfying the condition $k<-0.15n+0.16$ (n is refractive index and k is extinction coefficient) (See FIG. 4). In this example, after the formation of the lower layer of the Ru film, the film was once opened to the atmosphere.

After the protection film was formed, the reflectance of EUV light (reflectance of first EUV light L1 shown in FIG. 3) was measured and found to be 65.1% at the maximum.

Figure 7A:
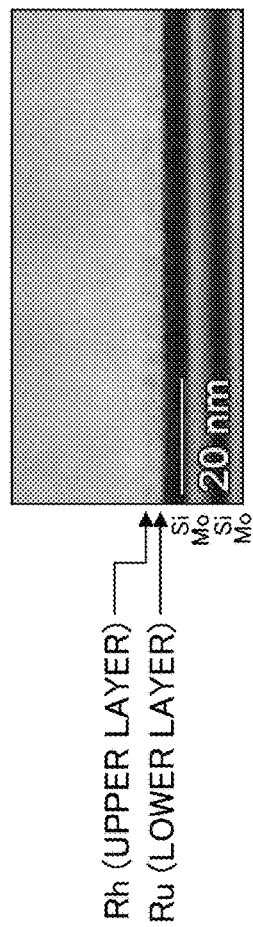
FIGS. 7A and 7B are views showing analysis and observation results of the reflective mask blank of Example 1.
Figure 7B:
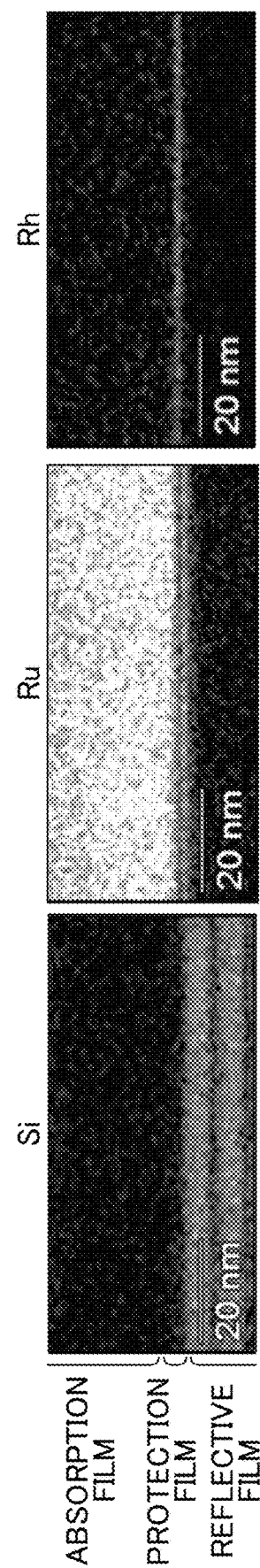

Subsequently, a Ru film, a TaN film, and a TaON film were sequentially formed from bottom to top as an absorption film on the protection film. The Ru film was formed by a DC sputtering method, and the TaN film and the TaON film were formed by a reactive sputtering method. A cross section of the obtained reflective mask blank taken along the thickness direction (Z-axis direction) was subjected to an elemental analysis and a shape observation using a TEM equipped with an energy dispersion type X-ray analyzer. FIG. 7A shows a dark field image of a cross section of a portion including the protection film, and FIG. 7B shows an element mapping image detected for a main element. In FIG. 7B, the positions of the images in the thickness direction are aligned with each other. In FIG. 7B, the concentration of each element is represented by gray scale. The brighter the color, the higher the concentration of each element. The same applies to FIG. 8B and FIG. 9B.

Example 2

A reflective mask blank was fabricated in the same manner as in Example 1 except for the film formation conditions for the protection film. In Example 2, a protection film having a two-layer structure including a lower layer of a Nb film and an upper layer of a Rh film was formed on the Si layer which was the uppermost layer of the Si/Mo multilayer reflective film. To be more specific, a Nb film (thickness: 0.5 nm) was formed as a lower layer of the protection film by the magnetron sputtering method, and a Rh film (thickness: 2.5 nm) was formed on the Nb film as an upper layer. Nb used in the lower layer is a material satisfying the condition $k<-0.15n+0.16$ (n is refractive index and k is extinction coefficient) (See FIG. 4). After the formation of the Si/Mo multilayer reflective film, the film was opened to the atmosphere, and the film formation was continuously performed without being opened to the atmosphere until the formation of the lower layer of the Nb film and the upper layer of the Rh film was completed after the formation of the Si/Mo multilayer reflective film.

After the protection film was formed, the reflectance of EUV light was measured in the same manner as in Example 1, and found to be 65.0% at the maximum.

Figure 8A:
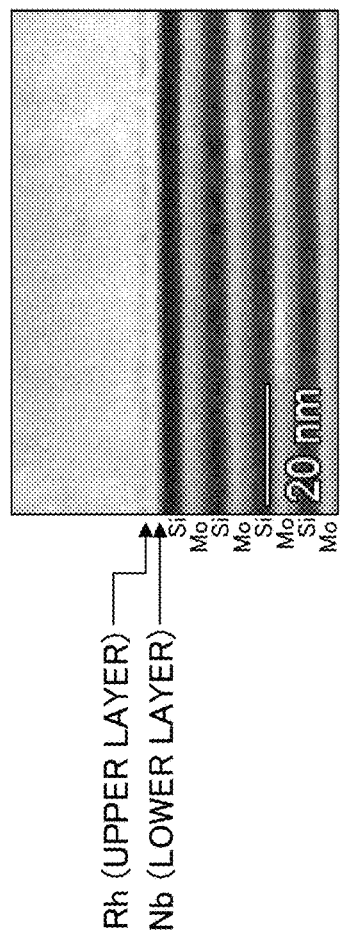
FIGS. 8A and 8B are views showing analysis and observation results of the reflective mask blank of Example 2.
Figure 8B:
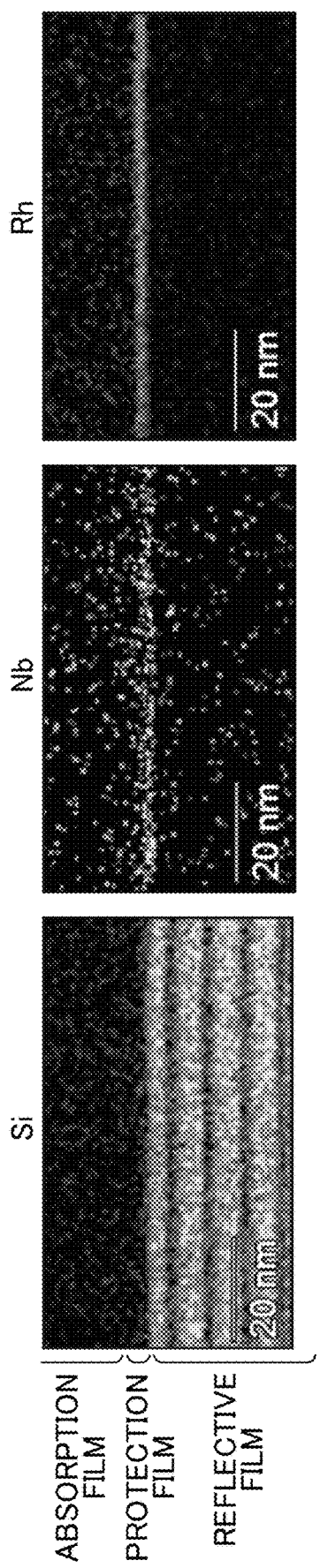

Further, in the same manner as in Example 1, a Ru film, a TaN film, and a TaON film were formed in this order from bottom to top as an absorption film on the protection film, thereby fabricating a reflective mask blank. In the same manner as in Example 1, a cross section in the thickness direction (Z-axis direction) of a portion including the protection film of the obtained reflective mask blank was analyzed and observed. The observation results are shown in FIGS. 8A and 8B.

Example 3

In Example 3, a protection film was formed by forming a Rh film (thickness: 2.5 nm) by the magnetron sputtering method on the Si layer which was the uppermost layer of the Si/Mo multilayer reflective film formed in the same manner as in Example 1.

After the protection film was formed, the reflectance of EUV light was measured in the same manner as in Example 1, and found to be 63.9% at the maximum.

Further, a Ru film was formed as an absorption film on the protection film by the DC sputtering method, thereby fabricating a reflective mask blank. In the same manner as in Example 1, a cross section in the thickness direction (Z-axis direction) of a portion including the protection film of the obtained reflective mask blank was analyzed and observed. The observation results are shown in FIGS. 9A and 9B.

As described above, the reflectance of EUV light measured after the formation of the protection film was 65.1% (Example 1) and 65.0% (Example 2) at the maximum in the configuration in which the protection film including the upper layer formed of the Rh film and the lower layer containing the material satisfying the condition $k<-0.15n+0.16$ was formed, whereas the reflectance of EUV light measured after the formation of the protection film was decreased to 63.9% in the configuration (Example 3) in which the protection film including the single Rh film was formed.

Figure 9A:
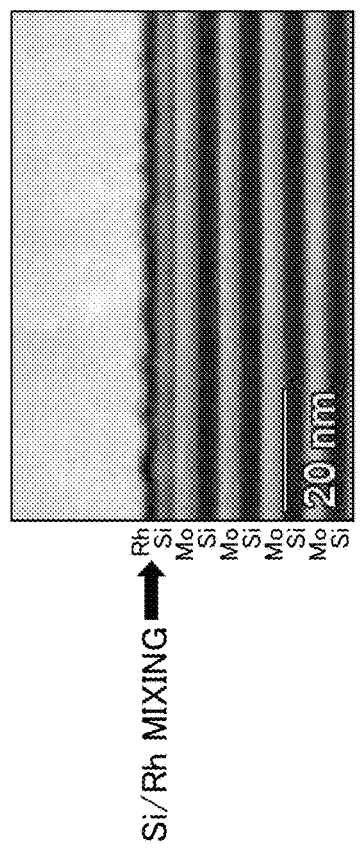
FIGS. 9A and 9B are views showing analysis and observation results of the reflective mask blank of Example 3.
Figure 9B:
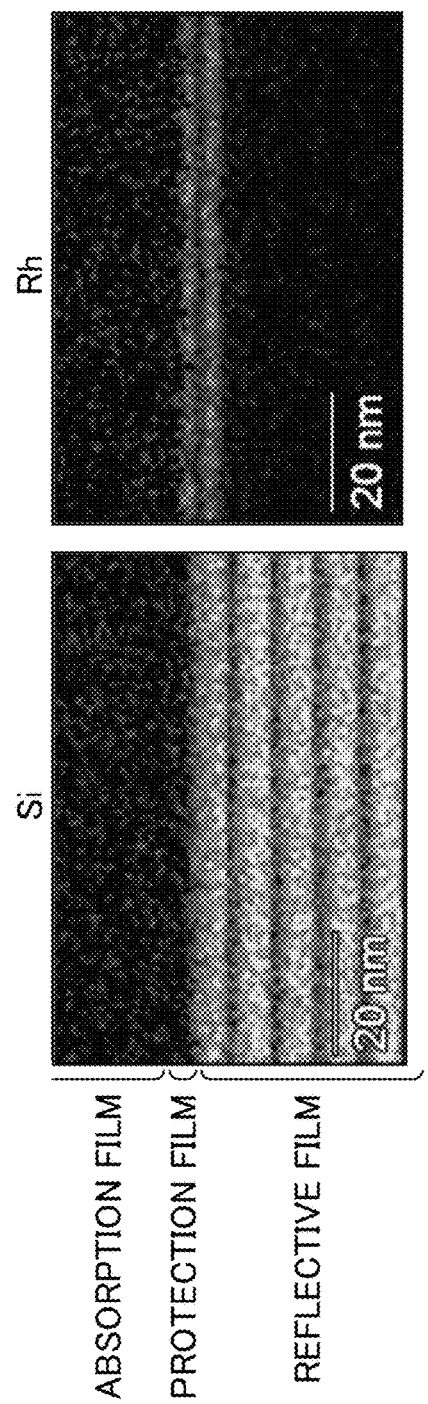

From FIGS. 7 to 9, it was found that the interface between the protection film and the uppermost Si film of the Mo/Si multilayer reflective film was flat in Example 1 and Example 2 (FIG. 7A and FIG. 8A), but disturbance was observed in the interface in Example 3 (FIG. 9A), and mixing occurred. Further, in Example 1 and Example 2, it was found that the region of the distribution of Rh and the region of the distribution of Si did not substantially overlap with each other, and the diffusion of Rh was suppressed (FIG. 7B and FIG. 8B). In Example 3, it was found that the region of the distribution of Rh and the region of the distribution of Si overlapped with each other, and mixing occurred between Rh and Si (FIG. 9B).

Example 4

A reflective mask blank was fabricated in the same manner as in Example 1 except for the film formation conditions for the protection film. In Example 4, a protection film having a two-layer structure including a lower layer of a Ta film and an upper layer of a Rh film was formed on the Si layer which was the uppermost layer of the Si/Mo multilayer reflective film. To be more specific, a Ta film (thickness: 0.9 nm) was formed as a lower layer of the protection film by the magnetron sputtering method, and a Rh film (thickness: 2.3 nm) was formed on the Ta film as an upper layer. Ta used in the lower layer is a material that does not satisfy the condition $k<-0.15n+0.16$ (n is refractive index and k is extinction coefficient) (See FIG. 4). After the formation of the Si/Mo multilayer reflective film, the multilayer reflective film was opened to the atmosphere, and the film formation was continuously performed without being opened to the atmosphere until the formation of the lower layer of the Ta film and the upper layer of the Rh film was completed after the formation of the multilayer reflective film.

After the protection film was formed, the reflectance of EUV light was measured in the same manner as in Example 1, and found to be 63.5% at the maximum.

Example 5

A reflective mask blank was fabricated in the same manner as in Example 4 except for the thickness of the lower layer of the Ta film. In Example 5, a protection film having a two-layer structure including a lower layer of a Ta film and an upper layer of a Rh film was formed on the Si layer which was the uppermost layer of the Si/Mo multilayer reflective film. To be more specific, a Ta film (thickness: 1.3 nm) was formed as a lower layer of the protection film by the magnetron sputtering method, and a Rh film (thickness: 2.4 nm) was formed as an upper layer on the Ta film by the ion beam sputtering method. Ta used in the lower layer is a material that does not satisfy the condition k<−0.15n+0.16 (n is refractive index and k is extinction coefficient) (See FIG. 4). After the formation of the Si/Mo multilayer reflective film, the film was opened to the atmosphere, and the film formation was continuously performed without being opened to the atmosphere until the formation of the lower layer of the Ta film and the upper layer of the Rh film was completed after the formation of the Si/Mo multilayer reflective film.

After the protection film was formed, the reflectance of EUV light was measured in the same manner as in Example 1, and found to be 61.7% at the maximum.

Example 6

A reflective mask blank was fabricated in the same manner as in Example 1 except for the film formation conditions for the protection film. In Example 6, a protection film having a two-layer structure including a lower layer of a Ru film and an upper layer of a Rh film was formed on the Si layer which was the uppermost layer of the Si/Mo multilayer reflective film. To be more specific, a Ru film (thickness: 0.9 nm) was formed as a lower layer of the protection film by the ion beam sputtering method, and a Rh film (thickness: 1.6 nm) was formed as an upper layer on the Ru film by the ion beam sputtering method. Ru used in the lower layer is a material satisfying the condition k<−0.15n+0.16 (n is refractive index and k is extinction coefficient) (See FIG. 4). The film formation was continuously performed without exposure to the atmosphere from the start of film formation of the Si/Mo multilayer reflective film until the completion of film formation of the lower layer of the Ru film and the upper layer of the Rh film.

After the protection film was formed, the reflectance of EUV light was measured in the same manner as in Example 1, and found to be 65.8% at the maximum.

Example 7

A reflective mask blank was fabricated in the same manner as in Example 6 except for the thickness of the protection film. In Example 7, a protection film having a two-layer structure including a lower layer of a Ru film and an upper layer of a Rh film was formed on the Si layer which was the uppermost layer of the Si/Mo multilayer reflective film. To be more specific, a Ru film (thickness: 0.9 nm) was formed as a lower layer of the protection film by the ion beam sputtering method, and a Rh film (thickness: 1.8 nm) was formed as an upper layer on the Ru film by the ion beam sputtering method. Ru used in the lower layer is a material satisfying the condition k<−0.15n+0.16 (n is refractive index and k is extinction coefficient) (See FIG. 4). The film formation was continuously performed without exposure to the atmosphere from the start of film formation of the Si/Mo multilayer reflective film until the completion of film formation of the lower layer of the Ru film and the upper layer of the Rh film.

After the protection film was formed, the reflectance of EUV light was measured in the same manner as in Example 1, and found to be 65.7% at the maximum.

Example 8

A reflective mask blank was prepared in the same manner as in Example 6 except for the thickness of the protection film. In Example 8, a protection film having a two-layer structure including a lower layer of a Ru film and an upper layer of a Rh film was formed on the Si layer which was the uppermost layer of the Si/Mo multilayer reflective film. To be more specific, a Ru film (thickness: 0.9 nm) was formed as a lower layer of the protection film by the ion beam sputtering method, and a Rh film (thickness: 2.0 nm) was formed as an upper layer on the Ru film by the ion beam sputtering method. Ru used in the lower layer is a material satisfying the condition k<−0.15n+0.16 (n is refractive index and k is extinction coefficient) (See FIG. 4). The film formation was continuously performed without exposure to the atmosphere from the start of film formation of the Si/Mo multilayer reflective film until the completion of film formation of the lower layer of the Ru film and the upper layer of the Rh film.

After the protection film was formed, the reflectance of EUV light was measured in the same manner as in Example 1, and found to be 65.3% at the maximum.

Example 9

A reflective mask blank was fabricated in the same manner as in Example 6 except for the thickness of the protection film. In Example 9, a protection film having a two-layer structure including a lower layer of a Ru film and an upper layer of a Rh film was formed on the Si layer which was the uppermost layer of the Si/Mo multilayer reflective film. To be more specific, a Ru film (thickness: 1.1 nm) was formed as a lower layer of the protection film by the ion beam sputtering method, and a Rh film (thickness: 1.6 nm) was formed as an upper layer on the Ru film by the ion beam sputtering method. Ru used in the lower layer is a material satisfying the condition k<−0.15n+0.16 (n is refractive index and k is extinction coefficient) (See FIG. 4). The film formation was continuously performed without exposure to the atmosphere from the start of film formation of the Si/Mo multilayer reflective film until the completion of film formation of the lower layer of the Ru film and the upper layer of the Rh film.

After the protection film was formed, the reflectance of EUV light was measured in the same manner as in Example 1, and found to be 65.7% at the maximum.

Example 10

A reflective mask blank was fabricated in the same manner as in Example 6 except for the thickness of the protection film. In Example 10, a protection film having a two-layer structure including a lower layer of a Ru film and an upper layer of a Rh film was formed on the Si layer which was the uppermost layer of the Si/Mo multilayer reflective film. To be more specific, a Ru film (thickness: 1.1 nm) was formed as a lower layer of the protection film by the ion beam sputtering method, and a Rh film (thickness: 1.8 nm) was formed as an upper layer on the Ru film by the ion beam sputtering method. Ru used in the lower layer is a material satisfying the condition k<−0.15n+0.16 (n is refractive index and k is extinction coefficient) (See FIG. 4). The film formation was continuously performed without exposure to the atmosphere from the start of film formation of the Si/Mo multilayer reflective film until the completion of film formation of the lower layer of the Ru film and the upper layer of the Rh film.

After the protection film was formed, the reflectance of EUV light was measured in the same manner as in Example 1, and found to be 65.5% at the maximum.

Example 11

A reflective mask blank was prepared in the same manner as in Example 6 except for the thickness of the protection film. In Example 11, a protection film having a two-layer structure including a lower layer of a Ru film and an upper layer of a Rh film was formed on the Si layer which was the uppermost layer of the Si/Mo multilayer reflective film. To be more specific, a Ru film (thickness: 1.1 nm) was formed as a lower layer of the protection film by the ion beam sputtering method, and a Rh film (thickness: 2.0 nm) was formed as an upper layer on the Ru film by the ion beam sputtering method. Ru used in the lower layer is a material satisfying the condition k<−0.15n+0.16 (n is refractive index and k is extinction coefficient) (See FIG. 4). The film formation was continuously performed without exposure to the atmosphere from the start of film formation of the Si/Mo multilayer reflective film until the completion of film formation of the lower layer of the Ru film and the upper layer of the Rh film.

After the protection film was formed, the reflectance of EUV light was measured in the same manner as in Example 1, and found to be 65.0% at the maximum.

Example 12

A reflective mask blank was fabricated in the same manner as in Example 6 except for the thickness of the protection film. In Example 12, a protection film having a two-layer structure including a lower layer of a Ru film and an upper layer of a Rh film was formed on the Si layer which was the uppermost layer of the Si/Mo multilayer reflective film. To be more specific, a Ru film (thickness: 1.6 nm) was formed as a lower layer of the protection film by the ion beam sputtering method, and a Rh film (thickness: 1.6 nm) was formed as an upper layer on the Ru film by the ion beam sputtering method. Ru used in the lower layer is a material satisfying the condition k<−0.15n+0.16 (n is refractive index and k is extinction coefficient) (See FIG. 4). The film formation was continuously performed without exposure to the atmosphere from the start of film formation of the Si/Mo multilayer reflective film until the completion of film formation of the lower layer of the Ru film and the upper layer of the Rh film.

After the protection film was formed, the reflectance of EUV light was measured in the same manner as in Example 1, and found to be 65.3% at the maximum.

Example 13

A reflective mask blank was fabricated in the same manner as in Example 6 except for the thickness of the protection film. In Example 12, a protection film having a two-layer structure including a lower layer of a Ru film and an upper layer of a Rh film was formed on the Si layer which was the uppermost layer of the Si/Mo multilayer reflective film. To be more specific, a Ru film (thickness: 1.6 nm) was formed as a lower layer of the protection film by the ion beam sputtering method, and a Rh film (thickness: 1.8 nm) was formed as an upper layer on the Ru film by the ion beam sputtering method. Ru used in the lower layer is a material satisfying the condition k<−0.15n+0.16 (n is refractive index and k is extinction coefficient) (See FIG. 4). The film formation was continuously performed without exposure to the atmosphere from the start of film formation of the Si/Mo multilayer reflective film until the completion of film formation of the lower layer of the Ru film and the upper layer of the Rh film.

After the protection film was formed, the reflectance of EUV light was measured in the same manner as in Example 1, and found to be 65.0% at the maximum.

Example 14

In Example 14, a protection film having a two-layer structure including a lower layer of a Ru film and an upper layer of a Rh film was formed on the Si layer which was the uppermost layer of the Si/Mo multilayer reflective film formed in the same manner as in Example 1. To be more specific, a Ru film (thickness: 0.9 nm) was formed as a lower layer of the protection film by the ion beam sputtering method, and a Rh film (thickness: 1.6 nm) was formed as an upper layer on the Ru film by the magnetron sputtering method. Ru used in the lower layer is a material satisfying the condition k<−0.15n+0.16 (n is refractive index and k is extinction coefficient) (See FIG. 4). In this example, after the formation of the lower layer of the Ru film, the laminated body was once opened to the atmosphere.

Further, a RuN film, a TaN film, and a TaON film were formed in this order from bottom to top as an absorption film on the protection film, thereby fabricating a reflective mask blank. All the absorption films were formed by the reactive sputtering method.

Example 15

In Example 15, a protection film having a two-layer structure including a lower layer of a Ru film and an upper layer of a Rh film was formed on the Si layer which was the uppermost layer of the Si/Mo multilayer reflective film formed in the same manner as in Example 1. To be more specific, a Ru film (thickness: 0.9 nm) was formed as a lower layer of the protection film by the ion beam sputtering method, and a Rh film (thickness: 1.6 nm) was formed as an upper layer on the Ru film by the magnetron sputtering method. Ru used in the lower layer is a material satisfying the condition k<−0.15n+0.16 (n is refractive index and k is extinction coefficient) (See FIG. 4). In this example, after the formation of the lower layer of the Ru film, the laminated body was once opened to the atmosphere.

Further, a TaON film and a RuTaON film were formed in this order from bottom to top as an absorption film on the protection film, thereby fabricating a reflective mask blank. All the absorption films were formed by the reactive sputtering method.

As described above, the reflective mask blank, the reflective mask, the method of manufacturing a reflective mask blank, and the method of manufacturing a reflective mask according to the present disclosure have been described. However, the present disclosure is not limited to the above-described embodiments and the like. Various variations, modifications, substitutions, additions, deletions, and combinations are possible within the scope of claims. They also of course fall within the technical scope of the present disclosure.

What is claimed is:

1. A reflective mask blank for EUV lithography comprising:
   a substrate;
   a multilayer reflective film that reflects EUV light;
   a protection film that protects the multilayer reflective film; and
   an absorption film that absorbs the EUV light, in this order from bottom to top, wherein
   the protection film includes an upper layer made of a rhodium-based material comprising Rh, or comprising Rh and at least one element selected from a group consisting of N, O, C, B, Ru, Nb, Mo, Ta, Ir, Pd, Zr, and Ti, the rhodium-based material containing 50 at % to 100 at % of Rh; and a lower layer containing at least one element selected from a group consisting of Ru, Nb, Mo, Zr, Y, C, and B, and satisfying a condition (I) in an EUV region $$k < -0.15n + 0.16 \qquad (I)$$

where n represents a refractive index and k represents an extinction coefficient.

2. The reflective mask blank according to claim 1, wherein
   the lower layer contains at least one element selected from a group consisting of Ru and Nb.

3. The reflective mask blank according to claim 1, wherein
   the refractive index n of the lower layer is 0.92 or less.

4. The reflective mask blank according to claim 1, wherein
   the lower layer contains Ru.

5. The reflective mask blank according to claim 1, wherein
   a thickness of the upper layer is 0.5 nm or more and 3.5 nm or less, and
   a thickness of the lower layer is 0.4 nm or more and 2.5 nm or less.

6. The reflective mask blank according to claim 1, wherein
   the absorption film comprises
   at least one element selected from Ru, Ir, Pt, Pd, Au, Ta, and Cr; and
   at least one non-metal element selected from O, B, and C.

7. The reflective mask blank according to claim 1 further comprising an etching mask film on the absorption film, wherein the etching mask film contains at least one element selected from a group consisting of Al, Hf, Y, Cr, Nb, Ti, Mo, Ta, and Si.

8. A reflective mask comprising the reflective mask blank according to claim 1, wherein
   a pattern is formed in the absorption film.

9. A method of manufacturing a reflective mask blank comprising:
   forming on a substrate a multilayer reflective film that reflects EUV light;
   forming on the multilayer reflective film a protection film that protects the multilayer reflective film; and
   forming on the protective film an absorption film that absorbs the EUV light, wherein
   the forming pf the protection film includes
   (i) forming a lower layer that contains at least one element selected from a group consisting of Ru, Nb, Mo, Zr, Y, C, and B, and satisfies a condition (I) in an EUV region $$k < -0.15n + 0.16 \qquad (I)$$

where n represents a refractive index and k represents an extinction coefficient; and
   (ii) forming an upper layer made of a rhodium-based material that comprises Rh, or comprises Rh and at least one element selected from a group consisting of N, O, C, B, Ru, Nb, Mo, Ta, Ir, Pd, Zr, and Ti, the rhodium-based material containing 50 at % to 100 at % of Rh.

10. The method of manufacturing a reflective mask blank according to claim 9, wherein
    the forming of the protective film is continuously performed without exposure to an atmosphere from a start of the forming the lower layer of the protection film until an end of the forming the upper layer of the protection film.

11. The method of manufacturing a reflective mask blank according to claim 10, wherein
    the forming of the multilayer film and the forming of the protective film are continuously performed without exposure to an atmosphere from a start of forming the multilayer reflective film until an end of the forming the lower layer and the upper layer of the protection film.

12. The method of manufacturing a reflective mask blank according to claim 10, wherein
    each of the lower layer and the upper layer of the protection film is formed using a magnetron sputtering method or an ion beam sputtering method.

13. The method of manufacturing a reflective mask blank according to claim 11, wherein
    each of the multilayer reflective film, and the lower layer and the upper layer of the protection film is formed using a magnetron sputtering method or an ion beam sputtering method.

14. A method of manufacturing a reflective mask, comprising:
    preparing the reflective mask blank manufactured by using the method of manufacturing a reflective mask blank according to claim 9; and
    forming an opening pattern in the absorption film.

* * * * *